United States Patent
Verhoeven et al.

(10) Patent No.: US 12,557,604 B2
(45) Date of Patent: Feb. 17, 2026

(54) DEGRADATION CIRCUIT

(71) Applicant: NXP B.V., Eindhoven (NL)

(72) Inventors: Henri Verhoeven, Someren (NL); Edwin Schapendonk, Oss (NL); Matheus Johannus Gerardus Lammers, Nederweert (NL); Oswald Moonen, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/606,562

(22) Filed: Mar. 15, 2024

(65) Prior Publication Data

US 2025/0293097 A1 Sep. 18, 2025

(51) Int. Cl.
*H01L 21/66* (2006.01)

(52) U.S. Cl.
CPC .............. *H01L 22/30* (2013.01); *H01L 22/20* (2013.01)

(58) Field of Classification Search
CPC ................................ H01L 22/20; H01L 22/30
USPC ........................................................ 327/564
See application file for complete search history.

(56) References Cited

U.S. PATENT DOCUMENTS

| | | | |
|---|---|---|---|
| 6,588,660 | B1 | 7/2003 | Buescher et al. |
| 10,725,077 | B2 | 7/2020 | Verhoeven et al. |
| 11,182,770 | B1 | 11/2021 | Yan et al. |
| 11,815,547 | B2 | 11/2023 | Tailliet |
| 2002/0017906 | A1 | 2/2002 | Ho et al. |
| 2007/0268113 | A1 | 11/2007 | Johnson |
| 2008/0036196 | A1 | 2/2008 | Steenblik et al. |
| 2010/0060427 | A1 | 3/2010 | Furumura et al. |
| 2012/0062268 | A1 | 3/2012 | Chevallier et al. |
| 2021/0110690 | A1 | 4/2021 | Suwald et al. |
| 2021/0383725 | A1* | 12/2021 | Dehmubed ........... G09F 3/0292 |
| 2023/0367917 | A1 | 11/2023 | Verhoeven et al. |

FOREIGN PATENT DOCUMENTS

| | | |
|---|---|---|
| DE | 102021108926 A1 | 10/2021 |
| WO | 2018125173 A1 | 7/2018 |

OTHER PUBLICATIONS

U.S. Appl. No. 18/810,404, filed Aug. 20, 2024; 42 pages.
U.S. Appl. No. 17/663,333; Non-Final Office Action mailed on Jun. 20, 2024; 27 pages.
U.S. Appl. No. 17/663,333; Notice of Allowance mailed on Sep. 30, 2024; 8 pages.
U.S. Appl. No. 17/663,333; Notice of Allowance mailed on Feb. 12, 2025; 9 pages.
U.S. Appl. No. 19/287,236, filed Jul. 31, 2025; 38 pages.
U.S. Appl. No. 19/190,356, filed Apr. 25, 2025; 33 pages.
Zhang, Z. et al.: "Strategy to Characterize Electromigration Short Length Effects in Cu/low-k Interconnects"; 2021 IEEE International Reliability Physics Symposium; Mar. 2021; 5 pages.

* cited by examiner

*Primary Examiner* — Tomi Skibinski

(57) ABSTRACT

One example discloses a degradation circuit, including: a first structure configured to be coupled to an integrated circuit (IC); a second structure, coupled to the first structure, and configured to be coupled to the IC; wherein together the first and second structures form a degradation detection element; and a controller, coupled to the degradation detection element, and configured to set an operational state of the IC based on the degradation detection element.

21 Claims, 4 Drawing Sheets

DEGRADATION CIRCUIT

The present specification relates to systems, methods, apparatuses, devices, articles of manufacture and instructions for detecting and remediating degradation in chips and/or chip packages.

SUMMARY

According to an example embodiment, a degradation circuit, comprising: a first structure configured to be coupled to an integrated circuit (IC); a second structure, coupled to the first structure, and configured to be coupled to the IC; wherein together the first and second structures form a degradation detection element; and a controller, coupled to the degradation detection element, and configured to set an operational state of the IC based on the degradation detection element.

In another example embodiment, the controller is configured to set the operational state to IC is fully functional (e.g. functioning as designed and/or within operational tolerances) if the degradation detection element indicates a value is within a first predetermined range.

In another example embodiment, the controller is configured to set the operational state to IC is partially functional (e.g. some IC functions not as designed and/or not within operational tolerances) if the degradation detection element indicates the value is within a second predetermined range.

In another example embodiment, the controller is configured to set the operational state to IC is non-functional (e.g. all or most IC functions not as designed and/or not within operational tolerances) if the degradation detection element indicates the value is within a third predetermined range.

In another example embodiment, the degradation detection element is a capacitor.

In another example embodiment, the degradation detection element includes a dielectric layer coupled between the first and second structures; the first structure is a first metal layer; and the second structure is a second metal layer.

In another example embodiment, the controller is configured to identify the operational state of the IC while the IC is powered up and actively operating.

In another example embodiment, the controller is configured to select a remediation action based on the operational state.

In another example embodiment, the remediation action includes shutting down a sub-set of circuits within the IC.

In another example embodiment, the remediation action includes shutting down a set of critical IC functionality and keeping a set of non-critical functionality activated.

In another example embodiment, the remediation action includes shutting down the IC's command and control functionality while keeping the IC's collection and transmission of sensor data activated.

In another example embodiment, the remediation action includes resetting the IC.

In another example embodiment, the remediation action includes activating a set of self-healing circuits configured to repair the detected degradation; and the self-healing circuits include a self-healing circuit configured to heat the IC and melt a self-healing material.

In another example embodiment, the remediation action includes at least one of: transmitting the operational state to a set of devices networked with the IC; activating a back-up circuit in the IC; and activating a set of enhanced IC monitoring tools.

In another example embodiment, the second structure includes a set of sub-structures; the set of sub-structures are coupled to different portions of the IC; together the first and the set of sub-structures form a set of degradation detection elements; and the controller is coupled to the set of degradation detection elements, and is configured to identify a set of operational states of the IC based on the set of degradation detection element.

In another example embodiment, the controller is configured to select a different remediation action for the different portions of the IC for each of the set of operational states.

In another example embodiment, the controller is configured to set an operational state, associated a set of the different portions of the IC, to non-functional, if the degradation detection elements associated with the set of the different portions of the IC have a value is within a predetermined range.

In another example embodiment, the controller is configured to shut down the set of the different portions of the IC that have the non-functional operational state.

In another example embodiment, the controller is configured to identify a robustness level of the IC; the controller is configured to set a first IC having a first robustness level to a first operational state if the degradation detection element has a value is within a predetermined range; and the controller is configured to set a second IC having a second robustness level to a second operational state, different from the first operational state, if the degradation detection element has the value is within the predetermined range.

In another example embodiment, the controller is configured to identify a robustness level of the IC; the robustness level of the IC has a first value if the IC is designed to be least susceptible to degradation; the robustness level of the IC has a second value if the IC is designed to be less susceptible to degradation; and the robustness level of the IC has a third value if the IC is most susceptible to degradation.

In another example embodiment, the degradation circuit and the IC are both configured to powered by a same power supply.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
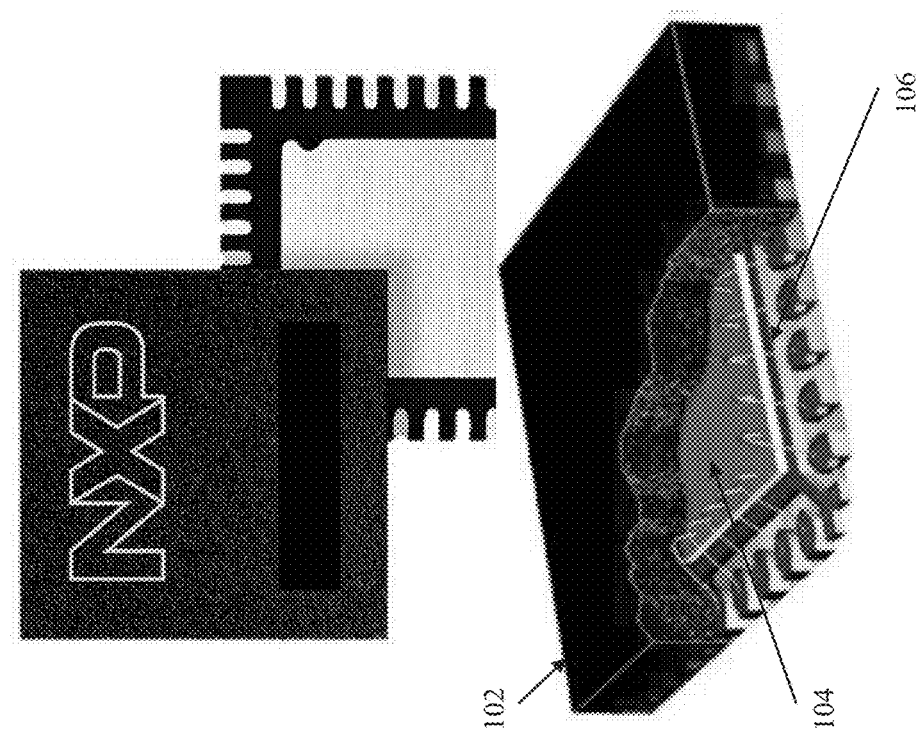
FIG. 1 represents a first example semiconductor device.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Semiconductor devices and other circuits during a normal course of their service life are susceptible to gradual and/or catastrophic failure. Manufacturers often base such device and circuit service life predictions on statistical failure rate data collected during testing and sometimes supplemented by in the field data from customers.

Such failure rate data is driven by the operational, environmental, and/or applications in which such devices and/or circuits are used.

For example device and circuit failures can be caused by: operational factors (e.g. repeated heating and cooling, high-current fusing, etc.); environmental factors (e.g. exposure to water, humidity, salt, UV, weathering, chemicals, etchants, radiation, etc.); and/or acute damage (e.g. shock, cracks, mechanical, chemical, radiation, etc.).

FIG. 1 represents a first example semiconductor device 100, that is susceptible to the operational, environmental and acute failures discussed above. The first example semiconductor device 100 at least includes an encapsulation material 102, an integrated circuit (IC) 104, and a lead frame 106.

In response to these operational, environmental and acute failures, the semiconductor device 100 may not function as designed within its specified tolerances.

Now discussed are systems, circuits and devices configured to improve functional safety by detecting varying levels of actual or impending failure (i.e. degradation) in an integrated circuit (IC), a device, a system, etc.

In various example embodiments, once degradation has been detected a variety of remediations may be employed, including: shutting down all or a sub-set of the IC's, device's, system's, etc. functionality; informing other connected and/or networked circuits, devices, systems, etc. that the IC, device, system, etc. is degraded; and/or activating back-up circuits, self-healing measures, enhanced monitoring tools, etc. configured to maintain a lower level of functional service.

Figure 2:
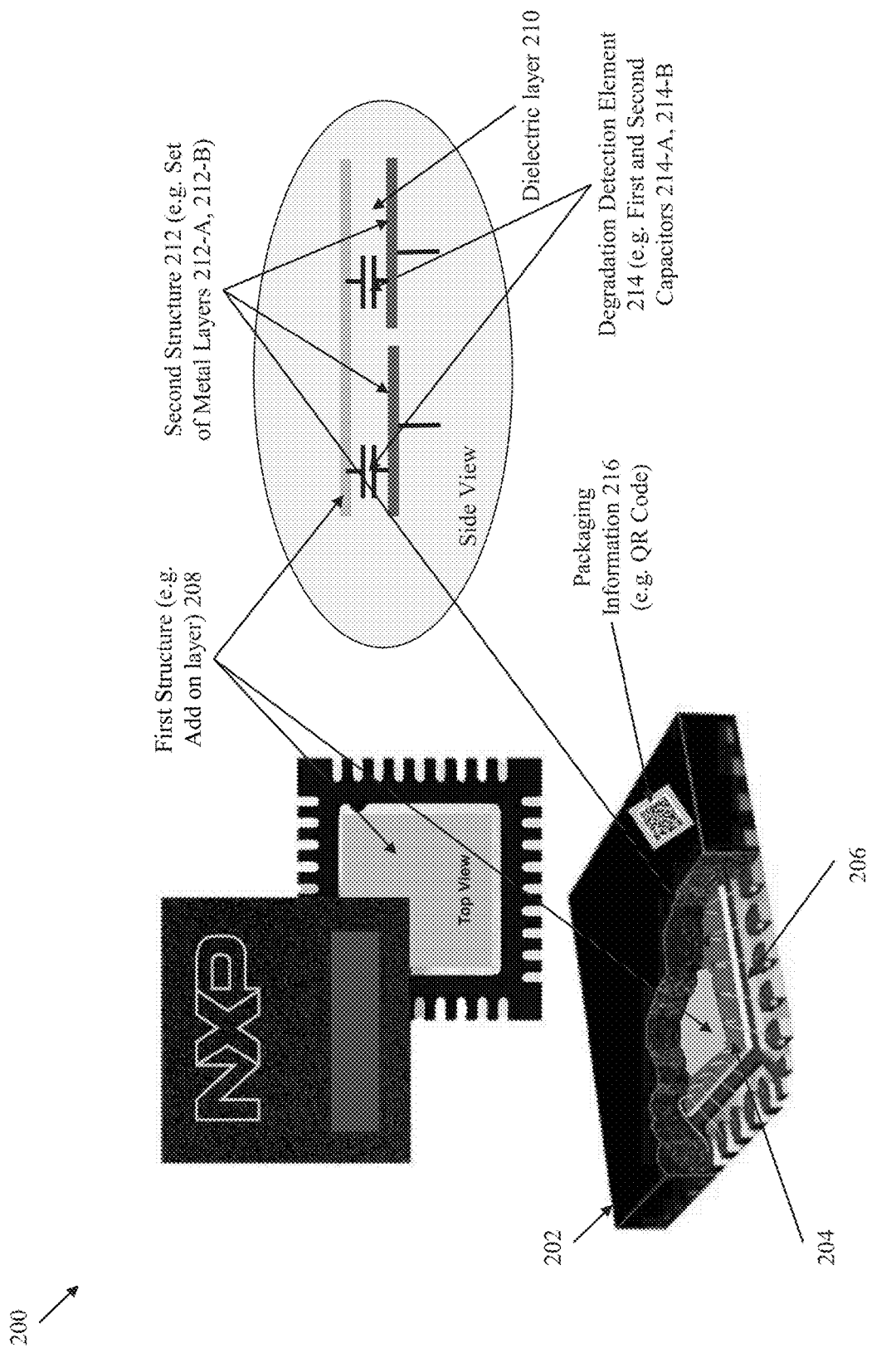
FIG. 2 represents a second example semiconductor device.

FIG. 2 represents a second example semiconductor device 200. The second semiconductor device 200 includes an encapsulation material 202, an integrated circuit (IC) 204, and a lead frame 206. Additionally the second semiconductor device 200 includes a first structure 208 (e.g. add on layer), a dielectric layer 210, and a second structure 212.

In various example embodiments, the first structure 208, the dielectric layer 210, and the second structure 212 may individually or each include one or more sub-elements. For example, in this example embodiment the second structure 212 includes a first metal layer 212-A and a second metal layer 212-B.

In some example embodiments the first structure 208 may be added to the second semiconductor device 200, while in other example embodiments is an existing structure within the second semiconductor device 200. Similarly, the metal layers 212-A, 212-B may in some example embodiments be separate from the IC 204, but in other example embodiments be an existing structure of the IC 204.

In one example embodiment, the first structure 208, the dielectric layer 210, and the second structures 212-A, 212-B form a first capacitor 214-A and a second capacitor 214-B in a degradation detection element 214.

While in this example embodiment the degradation detection element 214 is a set of capacitors 214-A, 214-B, in other example embodiments, the degradation detection element 214 may be formed using other electrical components, circuits, etc. and/or mechanical elements, switches, etc. Also, any capacitive structure may be implemented in a variety of forms, including as a SMD, a metal ring, a finger capacitor for tearing detection. Note that the controller (not shown) may be coupled to these capacitors and/or other electrical components, circuits, etc. in a variety of ways.

The second semiconductor device 200 also includes a controller (not shown) but which could in some examples be embedded in the IC 204. The second semiconductor device 200 may also include packaging information 216 (e.g. QR Code), perhaps on an outer surface of the second semiconductor device 200.

Generally, the controller (see FIG. 3 for an example) is coupled to the degradation detection element 214 and configured to set an operational state of the IC 204 based on a value (e.g. a variable, an on/off state, etc.) of the degradation detection element 214.

For example the controller may be configured to set the operational state to IC is fully functional (e.g. functioning as designed and/or within operational tolerances) if the degradation detection element indicates a value is within a first predetermined range; the controller may be configured to set the operational state to IC is partially functional (e.g. some IC functions not as designed and/or not within operational tolerances) if the degradation detection element indicates the value is within a second predetermined range; and the controller may be configured to set the operational state to IC is non-functional (e.g. all or most IC functions not as designed and/or not within operational tolerances) if the degradation detection element indicates the value is within a third predetermined range.

In various example embodiments, the degradation detection element 214 may include additional sub-structures (not shown) that may be included that are coupled to different portions of the IC 204. Taken together these additional sub-structures may form a set of degradation detection elements. In such example embodiments, the controller is coupled to these degradation detection elements, and is configured to identify a set of operational states of the IC based on these degradation detection elements.

The controller is further configured to select a remediation action based on these operational states. Thus in various example embodiments, the remediation action may include: shutting down a sub-set of circuits in the IC 204; transmitting the operational state to a set of devices networked with the IC 204; activating one or more back-up circuits in the IC 204; activating self-healing circuits in the IC 204; and/or activating a set of enhanced IC 204 monitoring tools.

Remediation actions may also include shutting down a set of critical IC 204 functionality and keeping a set of non-critical functionality activated; shutting down the IC's 204 command and control functionality while keeping the IC's 204 collection and transmission of sensor data activated; and/or resetting/rebooting the IC 204.

Self-healing circuits are herein defined to include circuits configured to repair the detected degradation, such as by localized heating of the IC 204 to melt a self-healing or self-sealing material.

Together, the controller and the degradation detection element 214 form a degradation circuit that enables the IC 204 to have a higher level of functional safety by detecting IC 204 degradation and implementing one or more remediations.

Such IC 204 degradation is normal and common to many operational and environmental conditions. For example degradation may be caused by normal IC 204 operation over time; by an acute failure (e.g. over-specification condition, over-voltage, ESG event, thermo-stress (heat or cold); and/or when for whatever reason the IC 204 is not functioning in the right way.

One example application could be an IC in a V2X (vehicle to everything) application where the IC is mounted on a light-pole and subject to severe weather conditions. Given the importance of the IC's role in traffic safety, a complete unexpected failure of the IC could lead to traffic accidents. The degradation circuit discussed herein enables the IC degradation to be detected early and the V2X network be notified so as not to cause any unexpected failures. Other applications in electric-GRID management may prevent extensive power losses to a large city.

For those example embodiments, where the degradation detection element 214 is formed by capacitors 214-A, 214-B, degradation of IC will affect a value of capacitance measured by the controller. For example, if the IC's package has been partly or totally destroyed or degraded, then the capacitor value will be influenced by the destruction.

Such capacitor damage may be caused by caustic substances that change a size of the capacitor; radiation exposure (e.g. UV light) that effects either the first structure 208, the dielectric 210 or the second structure 212; capacitor has been disconnected by a crack in the first or second structures 208, 212; capacitor has been split up in at least two parts; capacitor has a short between two plates; thermo-stress (e.g. over heating); and/or other harsh environments.

In various example embodiments, once degradation has been detected a variety of remediations may be employed by the controller, including: shutting down all or a sub-set of the IC's, device's, system's, etc. functionality; informing other connected and/or networked circuits, devices, systems, etc. that the IC, device, system, etc. is degraded; and/or activating back-up circuits, self-healing measures, enhanced monitoring tools, etc. configured to maintain a lower level of functional service.

Shutting down functional activity may also include shutting down "critical functionality" but not "all functionality" (e.g. shut down command and control functionality but continue collection and transmission of "sensor data"). For example in some example embodiments, the IC's 204 functionality may be organized in a hierarchy from "most critical" (e.g. control systems) to "less critical" (e.g. informational/sensor) functionality working approach.)

In networked IC 204 applications a degraded IC 204 instigate a network reconfiguration, generate user alerts.

Figure 3:
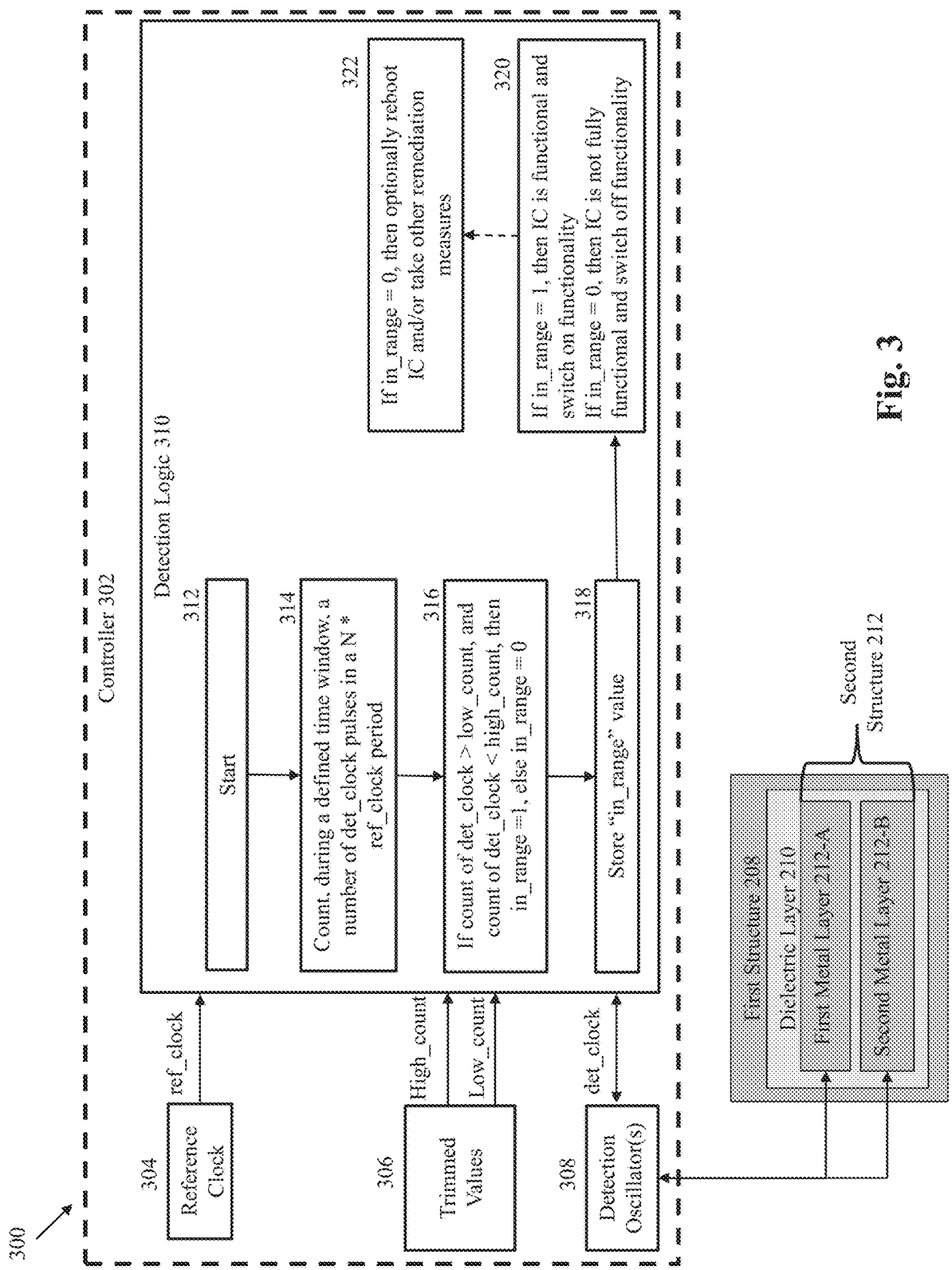
FIG. 3 represents an example of a degradation circuit.

FIG. 3 represents an example of a degradation circuit 300. The example degradation circuit 300 includes a controller 302, a reference clock 304, a set of trimmed values 306, a detection oscillator 308, and detection logic 310.

In this example, the detection oscillator 308 uses a capacitance formed by the first capacitor 214-A (i.e. formed by the first structure 208 (e.g. add on layer), the dielectric layer 210, and the first metal layer 212-A) and the second capacitor 214-B (i.e. formed by the first structure 208 (e.g. add on layer), the dielectric layer 210, and the second metal layer 212-B) to set a frequency of the detection oscillator 308.

If all is normal, then the frequency of the detection oscillator 308 remains fixed or within a predetermined range of frequencies. However, if the capacitance formed by the first capacitor 214-A and/or the second capacitor 214-B changes due to degradation, then the frequency of the detection oscillator 308 changes and falls outside of the predetermined range of frequencies, thereby indicating a degraded condition of the IC 204.

For example as shown in FIG. 3, the detection logic 310 receives the reference clock 304 (e.g. available on the IC); the trimmed values 306 (e.g. high_count and low_count value, one time programmed) and the detection oscillator 308.

The detection logic 310 in step 312 starts. Next in step 314, a Count (during a defined time window, a number of det_clock pulses in a N*ref_clock period) is measured. In step 316, if count of det_clock>low_count, and count of det_clock<high_count, then in_range=1, else in_range=0. In step 318, store in_range value. In step 320, if in_range=1, then IC is functional and switch on functionality. If in_range=0, then IC is not fully functional and switch off functionality. Then in step 322, if in_range=0, then optionally reboot IC and/or take other remediation measures.

In other example embodiments, instead of using the frequency of the detection oscillator 308 to detect degradation, a Q-factor amplitude (e.g. resistive losses) of the detection oscillator 308 could be used. The Q-factor amplitude will drop if the capacitor is degraded. Voltage levels are another indication.

Figure 4:
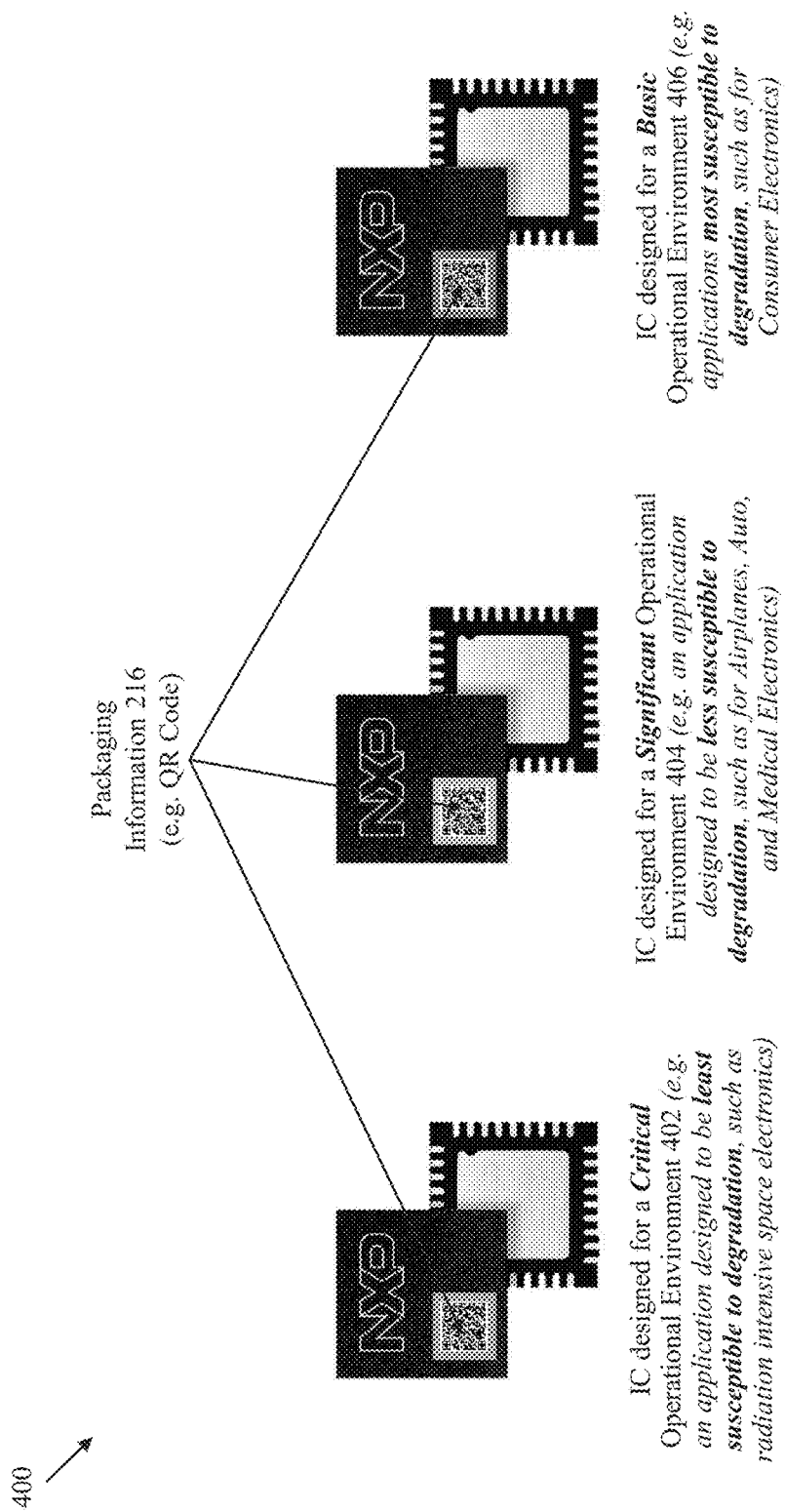
FIG. 4 represents an example set of semiconductor devices including degradation circuits.

FIG. 4 represents an example 400 set of semiconductor devices including degradation circuits.

While the example 400 semiconductor devices are labeled with the packaging information 216 (e.g. QR Code) introduced earlier, such packaging information 216 may also be encoded/programmed into each of the semiconductor devices' ICs.

In this example 400, a first semiconductor device includes a first IC designed for a critical operational environment 402 (e.g. an application designed to be least susceptible to degradation, such as radiation intensive space electronics); a second semiconductor device includes a second IC designed for a significant operational environment 404 (e.g. an application designed to be less susceptible to degradation, such as for Airplanes, Auto, and Medical Electronics); and a third semiconductor device includes a third IC designed for a Basic Operational Environment 406 (e.g. applications most susceptible to degradation, such as for Consumer Electronics).

Note, these labels (i.e. critical, significant, basic, and/or least, less, most) may be replaced with other labels and/or meaning in different example applications.

In those example embodiments including such packaging information 216, the controller is configured to identify a robustness level of the IC. For example, the controller can be configured to set the first IC to a first robustness level and thus to a first operational state if the degradation detection element has a value is within a predetermined range. The controller then sets the second IC to a second robustness level and thus to a second operational state, different from the first operational state, if the degradation detection element has the value is within the predetermined range. Finally, the controller sets the third IC to a third robustness level and thus to a third operational state, different from the first and second operational states, if the degradation detection element has the value is within the predetermined range.

In other words, since each of these ICs have different robustness levels, the controller in many example embodiments will set the operational state in a variable manor, such that each of the ICs is remediated in a different way appropriate to their different robustness levels.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A degradation circuit, comprising:
    a first structure configured to be coupled to an integrated circuit (IC);
    a second structure, coupled to the first structure, and configured to be coupled to the IC;
    wherein together the first and second structures form a degradation detection element; and
    a controller, coupled to the degradation detection element, and configured to set an operational state of the IC based on the degradation detection element;
    wherein the controller is configured to select a remediation action based on the operational state.

2. The degradation circuit of claim 1:
    wherein the controller is configured to set the operational state to IC is fully functional (e.g. functioning as designed and/or within operational tolerances) if the degradation detection element indicates a value is within a first predetermined range.

3. The degradation circuit of claim 2:
    wherein the controller is configured to set the operational state to IC is partially functional (e.g. some IC functions not as designed and/or not within operational tolerances) if the degradation detection element indicates the value is within a second predetermined range.

4. The degradation circuit of claim 3:
    wherein the controller is configured to set the operational state to IC is non-functional (e.g. all or most IC functions not as designed and/or not within operational tolerances) if the degradation detection element indicates the value is within a third predetermined range.

5. The degradation circuit of claim 1:
    wherein the degradation detection element is a capacitor.

6. The degradation circuit of claim 1:
    wherein the degradation detection element includes a dielectric layer coupled between the first and second structures;
    wherein the first structure is a first metal layer; and
    wherein the second structure is a second metal layer.

7. The degradation circuit of claim 1:
    wherein the controller is configured to identify the operational state of the IC while the IC is powered up and actively operating.

8. The degradation circuit of claim 1:
    wherein the remediation action includes shutting down a sub-set of circuits within the IC.

9. The degradation circuit of claim 1:
    wherein the remediation action includes shutting down a set of critical IC functionality and keeping a set of non-critical functionality activated.

10. The degradation circuit of claim 1:
    wherein the remediation action includes shutting down the IC's command and control functionality while keeping the IC's collection and transmission of sensor data activated.

11. The degradation circuit of claim 1:
    wherein the remediation action includes resetting the IC.

12. The degradation circuit of claim 1:
    wherein the remediation action includes activating a set of self-healing circuits configured to repair the detected degradation; and
    wherein the self-healing circuits include a self-healing circuit configured to heat the IC and melt a self-healing material.

13. The degradation circuit of claim 1:
    wherein the remediation action includes at least one of:
        transmitting the operational state to a set of devices networked with the IC; activating a back-up circuit in the IC; and activating a set of enhanced IC monitoring tools.

14. The degradation circuit of claim 1:
wherein the second structure includes a set of sub-structures;
wherein the set of sub-structures are coupled to different portions of the IC;
wherein together the first and the set of sub-structures form a set of degradation detection elements; and
wherein the controller is coupled to the set of degradation detection elements, and is configured to identify a set of operational states of the IC based on the set of degradation detection element.

15. The degradation circuit of claim 14:
wherein the controller is configured to select a different remediation action for the different portions of the IC for each of the set of operational states.

16. The degradation circuit of claim 14:
wherein the controller is configured to set an operational state, associated a set of the different portions of the IC, to non-functional, if the degradation detection elements associated with the set of the different portions of the IC have a value is within a predetermined range.

17. The degradation circuit of claim 16:
wherein the controller is configured to shut down the set of the different portions of the IC that have the non-functional operational state.

18. The degradation circuit of claim 1:
wherein the controller is configured to identify a robustness level of the IC;
wherein the robustness level of the IC has a first value if the IC is designed to be least susceptible to degradation;
wherein the robustness level of the IC has a second value if the IC is designed to be less susceptible to degradation; and
wherein the robustness level of the IC has a third value if the IC is most susceptible to degradation.

19. The degradation circuit of claim 1:
wherein the degradation circuit and the IC are both configured to powered by a same power supply.

20. A degradation circuit, comprising:
a first structure configured to be coupled to an integrated circuit (IC);
a second structure, coupled to the first structure, and configured to be coupled to the IC;
wherein together the first and second structures form a degradation detection element; and
a controller, coupled to the degradation detection element, and configured to set an operational state of the IC based on the degradation detection element;
wherein the second structure includes a set of sub-structures;
wherein the set of sub-structures are coupled to different portions of the IC;
wherein together the first and the set of sub-structures form a set of degradation detection elements; and
wherein the controller is coupled to the set of degradation detection elements, and is configured to identify a set of operational states of the IC based on the set of degradation detection element.

21. A degradation circuit, comprising:
a first structure configured to be coupled to an integrated circuit (IC);
a second structure, coupled to the first structure, and configured to be coupled to the IC;
wherein together the first and second structures form a degradation detection element; and
a controller, coupled to the degradation detection element, and configured to set an operational state of the IC based on the degradation detection element;
wherein the controller is configured to identify a robustness level of the IC;
wherein the controller is configured to set a first IC having a first robustness level to a first operational state if the degradation detection element has a value is within a predetermined range; and
wherein the controller is configured to set a second IC having a second robustness level to a second operational state, different from the first operational state, if the degradation detection element has the value is within the predetermined range.

* * * * *